US006483699B1

(12) United States Patent
Salmonson et al.

(10) Patent No.: US 6,483,699 B1
(45) Date of Patent: Nov. 19, 2002

(54) BAFFLE SYSTEM FOR AIR COOLED COMPUTER ASSEMBLY

(75) Inventors: Richard B. Salmonson, Chippewa Falls; David Paul Gruber, Mondovi; Stephen A. Bowen, Chippewa Falls, all of WI (US)

(73) Assignee: Silicon Graphics, Inc., Mountain View, CA (US)

( * ) Notice: Subject to any disclaimer, the term of this patent is extended or adjusted under 35 U.S.C. 154(b) by 65 days.

(21) Appl. No.: 09/619,818

(22) Filed: Jul. 20, 2000

(51) Int. Cl.$^7$ ................................................ H05K 7/20
(52) U.S. Cl. ....................... 361/687; 361/695; 361/690; 361/719; 165/80.3; 174/260; 174/15.1
(58) Field of Search ................................ 361/682–696, 361/760, 717–719; 165/80.3, 121–126; 174/15.1, 16.1, 255, 860, 252; 312/236; 454/184

(56) References Cited

U.S. PATENT DOCUMENTS

| 5,375,038 A | * | 12/1994 | Hardt | 361/694 |
| 5,428,503 A | * | 6/1995 | Matsushima et al. | 361/695 |
| 5,528,454 A | * | 6/1996 | Niklos | 361/695 |
| 5,694,294 A | * | 12/1997 | Ohashi et al. | 361/687 |
| 5,940,266 A | * | 8/1999 | Hamilton et al. | 361/695 |
| 6,134,104 A | * | 10/2000 | Mohi et al. | 361/683 |
| 6,219,234 B1 | * | 4/2001 | Sammakia et al. | 361/695 |

FOREIGN PATENT DOCUMENTS

JP 6-90092 * 3/1994 ............ H05K/7/20

* cited by examiner

Primary Examiner—Darren Schuberg
Assistant Examiner—Lisa Lea-Edmonds
(74) Attorney, Agent, or Firm—Schwegman, Lundberg, Woessner & Kluth

(57) ABSTRACT

An air cooled computer assembly including a printed circuit board assembly or a U sized enclosure. The computer assembly also includes three 120 mm fans positioned at one end of the PCB assembly providing air flow across the PCB assembly. The printed circuit board assembly has a top side and a bottom side, including heat producing components on the top side and bottom side. A portion of the heat producing components are DIMM memory positioned perpendicular to the direction of air flow. The computer assembly also includes an air baffling system positioned proximate to the PCB assembly. The air baffling system divides and balances the air flow between the heat producing components so that each of the components are adequately cooled. The air baffling system includes a flat baffle and pair of curved baffles. The flat baffle is positioned perpendicular to the direction of the air flow and is positioned between and in front of two 40 watt memory. The curved baffles are positioned adjacent to the two memory ASICs. One curved baffle is positioned between one memory ASIC and the outside of the PCB assembly and the other curved baffle is positioned between the other memory ASIC and the opposite side of the PCB assembly. The curved baffles include a curved portion, an extended portion and a front portion. The heat producing components include memory DIMMS, 4 130 watt microprocessors, and two 40 watt memory ASICs.

25 Claims, 3 Drawing Sheets

BAFFLE SYSTEM FOR AIR COOLED COMPUTER ASSEMBLY

FIELD OF THE INVENTION

The present invention relates to the field of air cooled computer systems. More particularly, this invention relates to a baffle system for directing air flow through a computer assembly having heat producing components, such as memory boards, transverse to the direction of the airflow.

BACKGROUND OF THE INVENTION

Providing adequate cooling to computer assemblies is becoming increasingly difficult as high powered heat producin components such as microprocessors, Application Specific Integrated Circuits (ASICs), and memory, create higher cooling demands. The cooling effectiveness is limited by the cost and noise of higher output fans. Typically, heat producing components such as microprocessors and ASIC's with heat sinks and memory boards are orientated parallel to the air flow to improve cooling characteristics. However, in some situations, orientating the heat producing components, such as memory boards and heat sinks perpendicular to the air flow would be preferred. For example, orientation of the memory boards perpendicular to the air flow provides improved electrical performance such as reducing trace lengths on the printed circuit board. In addition, heat producing components may also be located both above and below the printed circuit board (PCB), creating a need to provide adequate cooling to the heat producing components both above and below the PCB.

Typically, existing air flow capacity due to cost or noise constraints has not adequately cooled all of the heat producing components, forcing either larger or noisier fans or orientating the heat producing components in a less desirable layout in order to meet the cooling requirements of the system.

What is needed is a cooling system that allows the heat producing components to be located both above and below the PCB as well as orientation of heat producing components, such as memory boards, perpendicular to the air flow while still meeting noise and cost constraints.

SUMMARY OF THE INVENTION

The present invention provides an air baffle system for air cooled computer assemblies. One embodiment provides an air baffle system that provides distribution of airflow between the top and bottom sides of the printed circuit board as well as balanced cooling of perpendicular heat producing components such as DIMM memory boards and other heat producing components such as memory Application Specific Integrated Circuits (ASICs) and high powered microprocessors.

One embodiment provides an air cooled computer assembly including a tray structure, optionally, the computer assembly fits into an enclosure that is 3U sized (approximately 5.25 inches high×19 inches wide×24 inches long). The computer assembly also includes at least one fan positioned at one end of the tray structure for providing air flow through the enclosure. Optionally, the computer assembly includes a plurality of fans of no more than 120 mm in size. The assembly also includes a printed circuit board assembly positioned on the tray structure. The PCB assembly has a top side and a bottom side, including heat producing components on the top side and bottom side. A portion of the heat producing components are positioned perpendicular to the direction of air flow. The computer assembly also includes an air baffling system positioned proximate to the PCB assembly. The air baffling system divides, distributes,. and balances the air flow between the heat producing components so that each of the components are adequately cooled.

Optionally, the air baffling system includes a flat baffle and pair of curved baffles. The flat baffle is positioned perpendicular to the direction of the air flow and is positioned between and in front of two heat producing components such as memory ASICs. The curved baffles are positioned adjacent to the pair of memory ASICs. One curved baffle is positioned between one memory ASIC and the outside of the enclosure and the other curved baffle is positioned between the other memory ASIC and the opposite side of the enclosure.

Optionally, the curved baffles include a curved portion, an extended portion and a front portion. The curved portion is a quarter circular shaped curve facing inward.

Optionally, the perpendicular heat producing components are DIMM memory or memory boards.

Optionally, the memory ASICs are at least two 40 watt ASICs and the microprocessors are at least four 130 watt microprocessors.

The air baffle system provides a reduced cost computer assembly, that allows perpendicular heat producing components, such as DIMM memory, while still providing adequate cooling to high powered microprocessors, such as four 130 watt processors, memory ASICs, such as two 40 watt ASICs, and heat producing components both above and below the printed circuit board at an air flow rate of no more than 1600 cubic feet per minute at a noise level of no more than 56.8 dBA at one meter.

DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
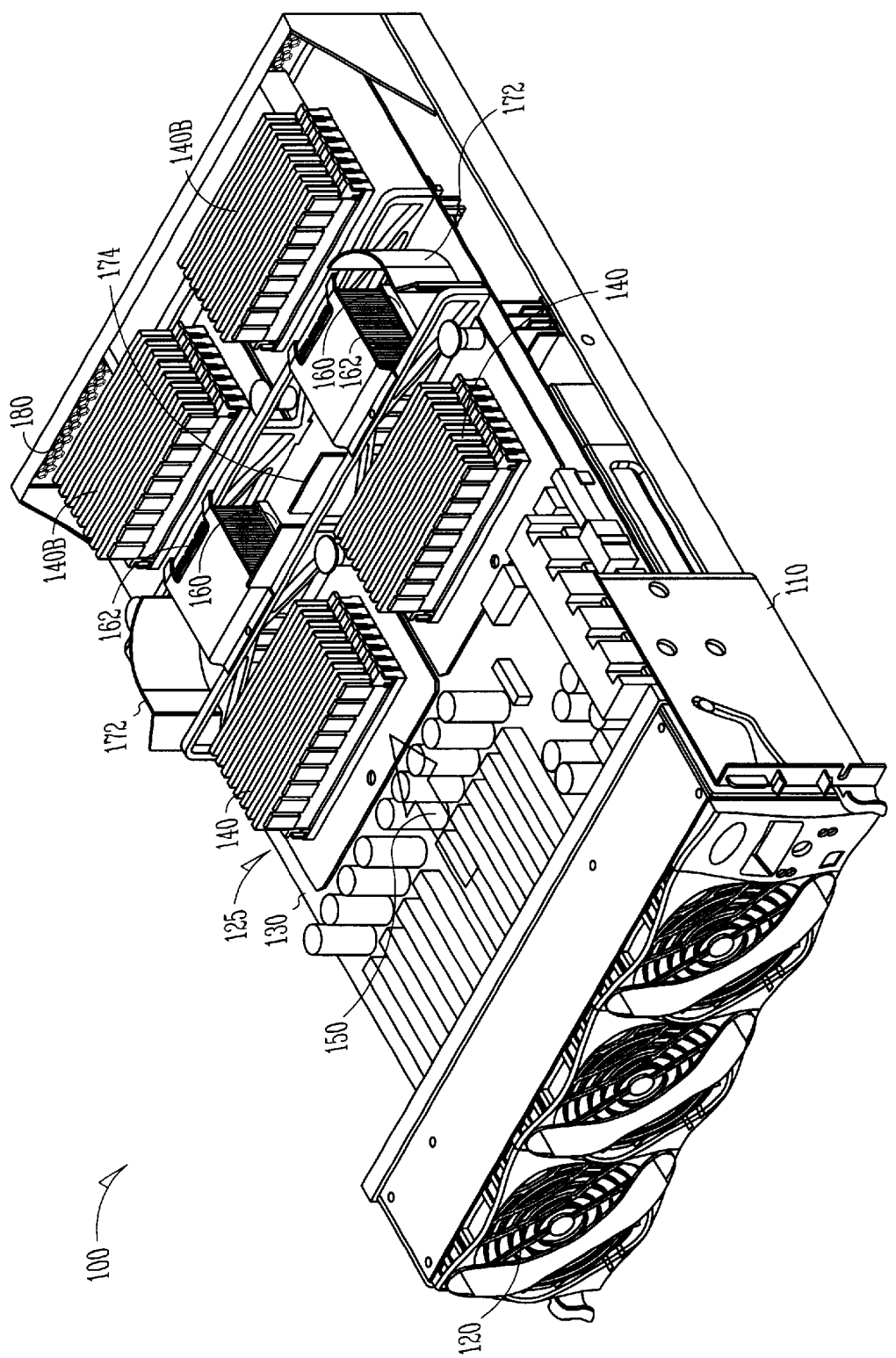
FIG. 1 is a perspective view of one embodiment of an air cooled computer assembly with a baffle system for directing the air flow.

FIG. 1 shows a perspective view of a computer assembly 100 on a tray assembly 110 for an enclosure in a 3U sized bay (5.25 inches high×19 inches wide ×24 inches long). Fans 120 are limited in size to 120 mm due to space constraints and fan speed is limited due to noise constraints.

One embodiment includes fans 120 that are EBM fan model W1G110-AG07-06. The three fans operating at 2400 rpm provide approximately 160 cubic feet per minute of air through the tray assembly 110 and 3U bay enclosure. The noise level at 1 meter is about 56.8 dBA.

The printed circuit board assembly 125 includes a printed circuit board 130 with heat producing components on both the top and bottom sides of the board. The top side includes memory DIMMS or memory boards 140. The memory boards 140 are positioned perpendicular to the flow of the air 150. The memory ASICs 160 are 40 watt memory ASICs with heat sinks 162 attached to the top of each memory ASIC 160.

A baffle system 170 redirects the flow of air 150 around and between the heat producing components. The baffle system 170 includes a pair of curved baffles 172 and a flat baffle 174.

Figure 2:
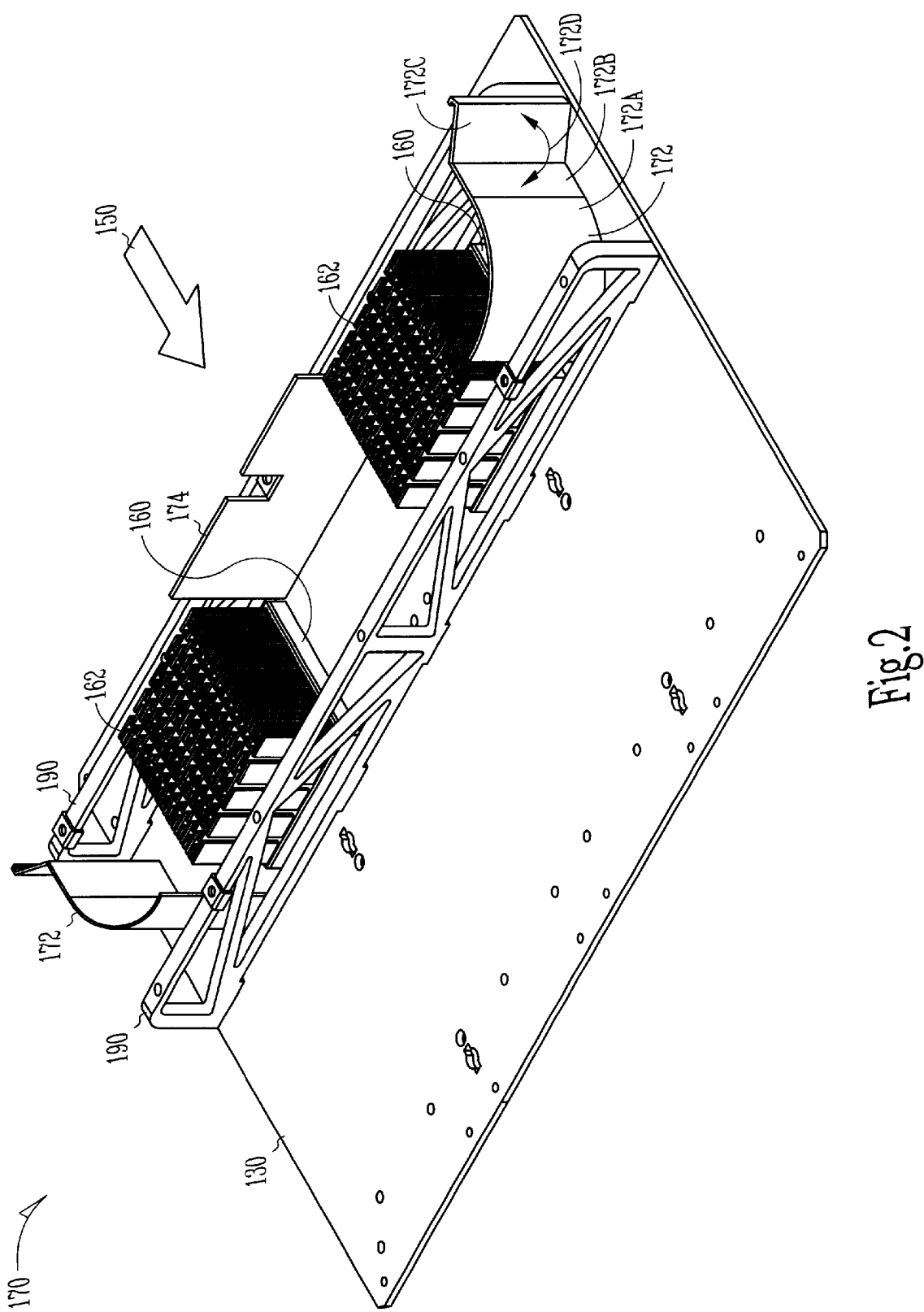
FIG. 2 is a perspective view of one embodiment of the baffle system with portions of the computer assembly removed.

FIG. 2 shows a rear perspective view of the baffle system 170 with portions of the computer assembly removed. The curved baffles 172 are located adjacent to the ASICs 160 so that the air flow 150 is directed through the heat sinks 162 on top of the ASICs 160. The flat baffle 174 restricts the flow of air so that an adequate amount of air is split between the top and bottom of the printed circuit board 130 so that heat producing components on top as well as the bottom of the PCB board 130 are adequately cooled.

The flat baffle 174 and curved baffles 172 are comprised of stamped metal such as steel or aluminum, such as sheetmetal approximately 0.036 inches in thickness. However, the baffles could also be constructed of any formable material such as plastic or composite. The curved baffles are attached between two support beams 190 that are secured to the printed circuit board 130. The curved baffles are attached to the top of the support beams with fasteners, however, other typical attachment methods such as adhesive could also be utilized.

The curved baffles 172 have a curved portion 172a, an extended portion 172b, and a front portion 172c. The curved portion 172a is a quarter circular curve facing inward with the back end approximately perpendicular to the airflow and the front end approximately parallel to the airflow. The curved portion has a radius of approximately 1.62 inches. The extended portion 172b extends into the direction of the airflow (towards the front) approximately parallel to the direction of the air flow.

The extended portion 172b extends from the curved portion 172a to the front portion 172c. The extended portion is approximately 0.7 inches long. The front portion 172c extends at an angle 172d from the extended portion 172b to the outside edge of the enclosure 110 and attaches to a support beam 190. Angle 172d is approximately 125 degrees and front portion 172c is approximately 0.85 inches long. Both the curved baffle and the flat baffle are approximately 2.0 inches high and extend substantially from the printed circuit board to the top of the tray assembly. The flat baffle as well as the length of the extended portion 172b, the length of the front portion 172c and the angle 172d work in combination to provide the proper amount of airflow to each of the heat producing components.

The flat baffle 174 is attached to a support beam 190 and is located in front of and between the two ASICs 160. The flat baffle 174 is attached to a support beam 190 with a fastener, however, other typical attachment methods such as adhesive could also be utilized. The flat baffle is flat and rectangular shaped and is approximately 2.0 inches high by approximately 4.5 inches long. The flat baffle may be stamped metal or any formed material as discussed above for the curved baffle.

The flat baffle is positioned in front of and between the two ASICs. The flat baffle 174 extends approximately from one memory ASIC to the other memory ASIC and from the top of the printed circuit board to the top of the tray assembly. The airflow 150 is directed around the flat baffle 174 and the curved baffles 172 and through the heat sinks 162 on top of the ASICs 160. The flat baffle also balances the airflow between the top and the bottom of the printed circuit board 130.

Figure 3:
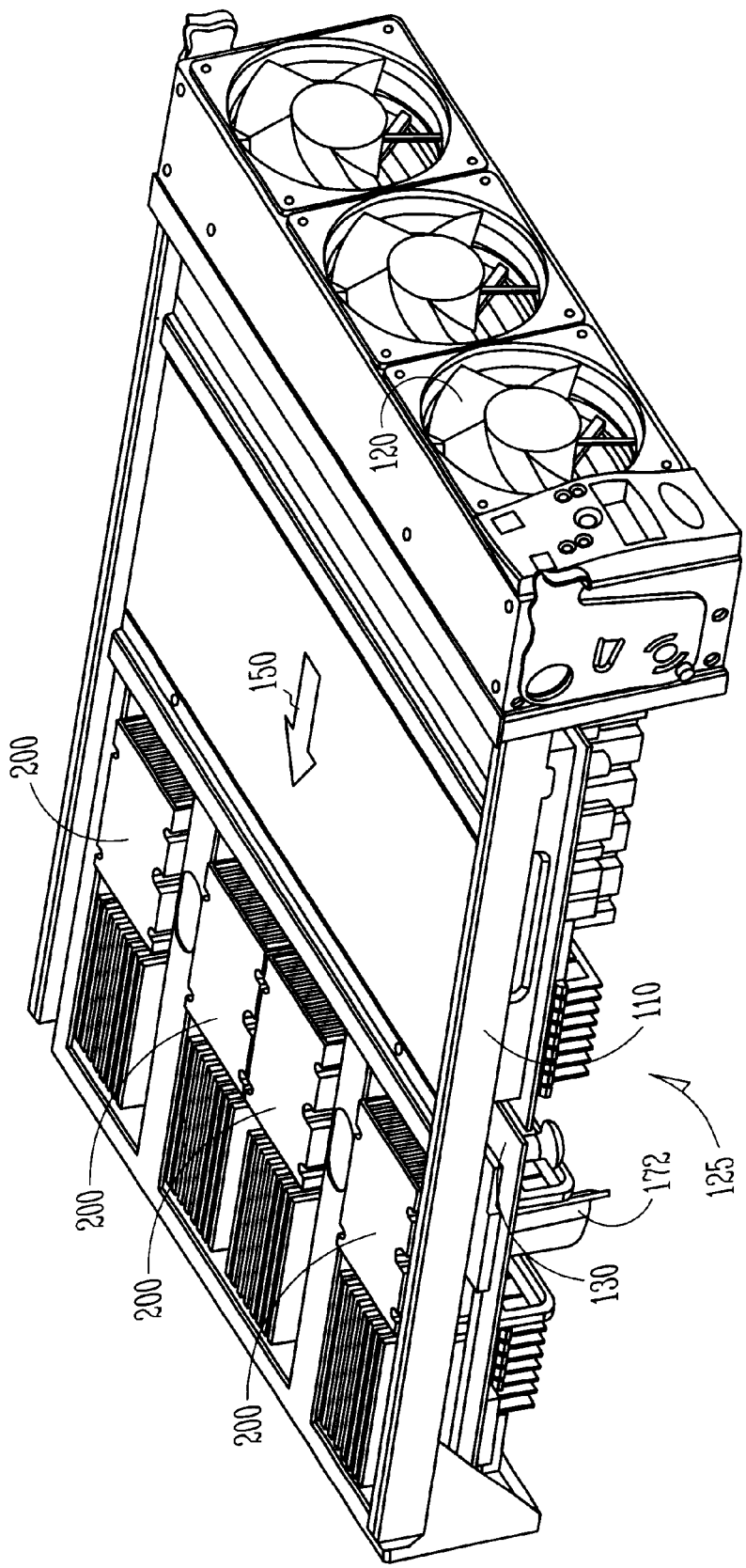
FIG. 3 is a bottom perspective view of one embodiment of the an air cooled computer assembly with a baffle system for directing the air flow showing a portion of the bottom side of the printed circuit board assembly.

FIG. 3 shows a bottom perspective view of the computer assembly 100. Heat producing components are located both above and below the printed circuit board 130. Heat producing components such as microprocessor 200, are located on the bottom side of the printed circuit board. Four high powered microprocessors, such as four 130 watt Intel microprocessors, are located on the bottom side of the printed circuit board.

Referring back to FIG. 1, the curved baffles 172 also redirect the airflow 150 back to the center of the enclosure so that adequate cooling is provided to the rear memory boards 140b. Otherwise, the airflow tends to escape out the sides of the tray assembly instead of flowing over the rear memory boards 140b located at the rear of the enclosure. The back 180 of the enclosure 110 is perforated to allow the air flow to exit the tray assembly and the 3U enclosure. Optionally, the back of the tray assembly is only partially perforated in certain areas to further balance air flow between the top and bottom or to fine tune the airflow after assembly.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An air cooled computer assembly comprising
   a printed circuit board assembly having a top side and a bottom side, the printed circuit board assembly having heat producing components on the top side and bottom side,
   at least one fan positioned at one end of the printed circuit board assembly for providing air flow to the top side and the bottom of the printed circuit board assembly;
   an air baffling system positioned proximate to the printed circuit board assembly;
   wherein a portion of the heat producing components are positioned perpendicular to the direction of air flow; and
   wherein the air baffling system includes a flat baffle element and a pair of curved baffle elements, and divides the air flow between the heat producing components.

2. The computer assembly of claim 1 wherein the flat baffle is positioned perpendicular to the direction of the air flow and is positioned between two of the heat producing components.

3. The computer assembly of claim 1 wherein the flat baffle is positioned in front of two the heat producing components.

4. The computer assembly of claim 1 wherein the curved baffles are positioned adjacent to two of the heat producing components.

5. The computer assembly of claim 4 wherein one curved baffle is positioned between one of the two of the heat producing component and the outside of the printed circuit board assembly and the other curved baffle is positioned between the other of the two of the heat producing components and the opposite side of the printed circuit board assembly.

6. The computer assembly of claim 1
wherein the flat baffle is positioned perpendicular to the direction of the air flow and is positioned between and in front of two of the heat producing components;
wherein the curved baffles are positioned adjacent to the two of the heat producing components; and
wherein one curved baffle is positioned between one of the two of the heat producing components and the outside of the printed circuit board assembly and the other curved baffle is positioned between the other of the two of the heat producing components and the opposite side of the printed circuit board assembly.

7. The computer assembly of claim 1 wherein the two of the heat producing components are memory ASICs.

8. The computer assembly of claim 1 wherein the curved baffles comprise a curved portion, an extended portion and a front portion.

9. The computer assembly of claim 8 wherein the curved portion is a quarter circular shaped curve facing inward.

10. The computer assembly of claim 1 wherein the at least one fan is no larger than 120 mm.

11. The computer assembly of claim 10 further comprising two additional fans no larger than 120 mm wherein the at least one fan and the two additional fans provide no more than approximately 160 cubic feet per minute of air flow.

12. The computer assembly of claim 10 further comprising two additional fans no larger than 120 mm wherein the at least one fan and the two additional fans operate at a noise level at 1 meter of no more than about 56.8 dBA.

13. The computer assembly of claim 12 wherein the heat producing components comprise at least four 130 watt high powered microprocessors and at least two 40 watt ASICs.

14. The computer assembly of claim 13 wherein the computer assembly is for a 3U sized enclosure.

15. The computer assembly of claim 13 wherein the perpendicular heat producing components are memory boards.

16. The computer assembly of claim 15 wherein the memory boards comprise DIMM memory.

17. The computer assembly of claim 1 wherein the computer assembly is for a 3U sized enclosure.

18. The computer assembly of claim 1 wherein the heat producing components comprise four 130 watt microprocessors and two 40 watt memory ASICs.

19. An air cooled computer assembly comprising
a printed circuit board assembly having a top side and a bottom side, the printed circuit board assembly having heat producing components on the top side and the bottom side;
a plurality of fans positioned at one end of the printed circuit board assembly for providing air flow to the printed circuit board assembly;
an air baffling system positioned proximate to the printed circuit board assembly;
wherein the air baffling system comprises a flat baffle and pair of curved baffles;
wherein the flat baffle is positioned perpendicular to the direction of the air flow and the flat baffle is positioned between and in front of two of the heat producing components;
wherein the curved baffles are positioned adjacent to the two of the heat producing components;
wherein one curved baffle is positioned between one of the two of the heat producing components and the outside of the printed circuit board assembly and the other curved baffle is positioned between the other of the two of the heat producing components and the opposite side of the printed circuit board assembly;
wherein a portion of the heat producing components are positioned perpendicular to the direction of air flow;
wherein the air baffling system divides the air flow between the heat producing components.

20. The computer assembly of claim 18 wherein the curved baffles comprise a curved portion, an extended portion and a front portion.

21. The computer assembly of claim 20 wherein the curved portion is a quarter circular shaped curve facing inward.

22. The computer assembly of claim 19 wherein the plurality of fans are each no larger than 120 mm.

23. The computer assembly of claim 19 wherein the perpendicular heat producing components are DIMM memory.

24. The computer assembly of claim 19 wherein the heat producing components comprise at least four 130 watt high powered microprocessors and two 40 watt ASICs.

25. The computer assembly of claim 24 wherein the computer assembly is for a 3U sized enclosure.

* * * * *

UNITED STATES PATENT AND TRADEMARK OFFICE
CERTIFICATE OF CORRECTION

| | | |
|---|---|---|
| PATENT NO. | : 6,483,699 B1 | Page 1 of 1 |
| DATED | : November 19, 2002 | |
| INVENTOR(S) | : Stephen A. Bowen, David P. Gruber and Richard B. Salmonson | |

It is certified that error appears in the above-identified patent and that said Letters Patent is hereby corrected as shown below:

<u>Title page,</u>
Item [74], *Attorney, Agent, or Firm*, insert -- P.A. -- after "Kluth".
Item [57], ABSTRACT,
Line 2, delete "or" after "assembly" and insert -- for -- therefor.

<u>Column 4,</u>
Line 59, insert -- of -- after "two".

<u>Column 5,</u>
Line 39, delete "claim 13" and insert -- claim 1 -- therefor --.

Signed and Sealed this

Twenty-third Day of September, 2003

JAMES E. ROGAN
*Director of the United States Patent and Trademark Office*